US012648274B2

(12) United States Patent
Hong et al.

(10) Patent No.: US 12,648,274 B2
(45) Date of Patent: Jun. 2, 2026

(54) DISPLAY DEVICE AND MANUFACTURING METHOD THEREOF

(71) Applicant: HON HAI PRECISION INDUSTRY CO., LTD., New Taipei City (TW)

(72) Inventors: Yu-Heng Hong, New Taipei City (TW); Shih-Chen Chen, New Taipei City (TW); Hao-Chung Kuo, New Taipei City (TW)

(73) Assignee: HON HAI PRECISION INDUSTRY CO., LTD., New Taipei City (TW)

(*) Notice: Subject to any disclaimer, the term of this patent is extended or adjusted under 35 U.S.C. 154(b) by 394 days.

(21) Appl. No.: 18/448,988

(22) Filed: Aug. 14, 2023

(65) Prior Publication Data

US 2024/0079536 A1     Mar. 7, 2024

(30) Foreign Application Priority Data

Sep. 6, 2022     (TW) ................................. 111133747

(51) Int. Cl.
| | |
|---|---|
| *H01L 33/50* | (2010.01) |
| *H10H 20/851* | (2025.01) |
| *H10W 90/00* | (2026.01) |
| *H10H 20/01* | (2025.01) |

(52) U.S. Cl.
CPC ........ H10H 20/8514 (2025.01); H10W 90/00 (2026.01); *H10H 20/0361* (2025.01)

(58) Field of Classification Search
CPC ........... H10H 20/8514; H10H 20/0361; H10H 20/855; H10H 20/8513; H01L 25/0753
See application file for complete search history.

(56) References Cited

U.S. PATENT DOCUMENTS

| | | | |
|---|---|---|---|
| 2019/0129243 A1* | 5/2019 | Meyer Timmerman Thijssen ...... | |
| | | | G02B 1/002 |
| 2019/0189864 A1* | 6/2019 | Ye ........................ | H10H 20/854 |

FOREIGN PATENT DOCUMENTS

| | | |
|---|---|---|
| CN | 111316155 A | 6/2020 |
| TW | 201928931 A | 7/2019 |
| TW | 202032822 A | 9/2020 |

(Continued)

OTHER PUBLICATIONS

Yang, Wenhong, et al. "All-dielectric metasurface for high-performance structural color." Nature communications, Commun 11, 1864 (2020).

(Continued)

*Primary Examiner* — Elmito Breval
(74) *Attorney, Agent, or Firm* — CKC & Partners Co., LLC

(57) ABSTRACT

A display device includes a first substrate, a plurality of light-emitting diodes, a first wavelength conversion layer and a metasurface. The light-emitting diodes are arranged on the first substrate, in which the light-emitting diodes emit a first color light, and the light-emitting diodes includes a first light-emitting diode, a second light-emitting diode and a third light-emitting diode. The first wavelength conversion layer is on the first light-emitting diode, and configured to convert the first color light emitted from the first light-emitting diode into a second color light, in which the second color light is different from the first color light. The meta-surface is above the first wavelength conversion layer, and configured to reflect the first color light and pass the second color light.

18 Claims, 16 Drawing Sheets

(56) References Cited

FOREIGN PATENT DOCUMENTS

| | | |
|---|---|---|
| TW | M603189 U | 10/2020 |
| TW | M638491 U | 3/2023 |

OTHER PUBLICATIONS

Chen, Junchi, et al. "Silver-Nanoparticle-Based Metallodielectric Wavelength-Selective Reflectors for Quantum-Dot-Enhanced White-Light-Emitting Diodes." ACS Applied Nano Materials, Dec. 2021, pp. 87-93.
Lin, Kai-Chen, et al. "Modified distributed Bragg reflector for protecting organic light-emitting diode displays against ultraviolet light." Opt. Express, vol. 29, No. 5, Mar. 1, 2021, pp. 7654-7665.
Ye, Zhi Ting and Jun-Yi Wu. "Use of Recycling-Reflection Color-Purity Enhancement Film to Improve Color Purity of Full-Color Micro-LEDs." Nanoscale Research Letters, vol. 17, Issue 1, Dec. 2022.

* cited by examiner

Giving height of the first meta-atoms and the second meta-atoms — S510

Giving a fixed period of the first meta-atoms and the second meta-atoms — S520

Establishing database of the first meta-atoms and the second meta-atoms with different width — S530

Determining width of the first meta-atoms and the second meta-atoms — S540

DISPLAY DEVICE AND MANUFACTURING METHOD THEREOF

CROSS-REFERENCE TO RELATED APPLICATION

This application claims priority to Taiwan Application Serial Number 111133747, filed Sep. 6, 2022, which is herein incorporated by reference in its entirety.

BACKGROUND

Field of Invention

The present disclosure relates to a display device and a manufacturing method thereof.

Description of Related Art

Modern display devices may include many light-emitting diode chips, and the light-emitting diode chips may match with different wavelength conversion layers to emit different color light. However, not all light emitted from the light-emitting diode chips will pass through the wavelength conversion material in the wavelength conversion layer, so the photoluminescence efficiency of the display device is not high. Moreover, the wavelength conversion material in the wavelength conversion layer is easily damaged by environment light. Therefore, the display device should be modified.

SUMMARY

Some embodiments of the present disclosure provide a display device including a first substrate, a plurality of light-emitting diodes, a first wavelength conversion layer and a metasurface. The light-emitting diodes are arranged on the first substrate, in which the light-emitting diodes emit a first color light, and the light-emitting diodes includes a first light-emitting diode, a second light-emitting diode and a third light-emitting diode. The first wavelength conversion layer is on the first light-emitting diode, and configured to convert the first color light emitted from the first light-emitting diode into a second color light, in which the second color light is different from the first color light. The metasurface is above the first wavelength conversion layer, and configured to reflect the first color light and pass the second color light.

In some embodiments, the metasurface includes a second substrate and a plurality of first meta-atoms. The second substrate is on the first wavelength conversion layer. The first meta-atoms are arranged on the first wavelength conversion layer and the second substrate, in which each of the first meta-atoms has a same height and a first width, and the first meta-atoms are arranged in a fixed period.

In some embodiments, the display device further includes a second wavelength conversion layer on the second light-emitting diode, and configured to convert the first color light emitted from the second light-emitting diode into a third color light, in which the first color light, the second color light and the third color light are different color lights.

In some embodiments, the second substrate of the metasurface is further above the second wavelength conversion layer, and the metasurface further includes a plurality of second meta-atoms arranged on the second wavelength conversion layer and the second substrate, in which each of the second meta-atoms have a same height and a second width, each of the second meta-atoms is in a second unit cell, and the second unit cells are arranged in the fixed period, wherein the first width is same as the second width.

In some embodiments, the first meta-atoms and the second meta-atoms are made of a same material.

In some embodiments, the second substrate of the metasurface is further above the second wavelength conversion layer, and the metasurface further includes a plurality of second meta-atoms arranged on the second wavelength conversion layer and the second substrate, in which each of the second meta-atoms has a same height and a second width, each of the second meta-atoms is in a second unit cell, and the second unit cells are arranged in the fixed period, in which a wavelength of the second color light is greater than a wavelength of the third color light, and the first width is greater than the second width.

In some embodiments, the first light-emitting diode, the first wavelength conversion layer, the second light-emitting diode, the second wavelength conversion layer and the third light-emitting diode constitute a pixel unit.

In some embodiments, the first meta-atoms are arranged along a first direction, and the first meta-atoms are not aligned with each other in the first direction.

In some embodiments, the first meta-atoms of the metasurface are not above the third light-emitting diode.

In some embodiments, the first wavelength conversion layer is between the metasurface and the first light-emitting diode.

In some embodiments, the display device further includes an adhesive layer between the first wavelength conversion layer and the metasurface.

Some embodiments of the present disclosure provide a manufacturing method of a display device including providing a first substrate. A first light-emitting diode, a second light-emitting diode, and a third light-emitting diode are arranged on the first substrate, in which the first light-emitting diode, the second light-emitting diode, and the third light-emitting diode emit a first color light. A first wavelength conversion layer is formed on the first light-emitting diode and a second wavelength conversion layer is formed on the second light-emitting diode, in which the first wavelength conversion layer is configured to convert the first color light emitted from the first light-emitting diode into a second color light, the second wavelength conversion layer is configured to convert the first color light emitted from the second light-emitting diode into a third color light, and the first color light, the second color light, and the third color light are different color light. A metasurface is formed above the first wavelength conversion layer, wherein the metasurface comprises a plurality of first meta-atoms above the first wavelength conversion layer, and the first meta-atoms are designed to reflect the first color light and pass the second color light.

In some embodiments, forming the metasurface above the first wavelength conversion layer includes disposing a second substrate above the first wavelength conversion layer, forming a meta-atom material layer on the second substrate, and forming the first meta-atoms above the first wavelength conversion layer by patterning the meta-atom material layer.

In some embodiments, the metasurface is further above the second wavelength conversion layer, and further includes a plurality of second meta-atoms above the second wavelength conversion layer, and the second meta-atoms are designed to reflect the first color light and pass the third color light.

In some embodiments, forming the metasurface above the second wavelength conversion layer includes disposing the second substrate above the second wavelength conversion layer, forming the meta-atom material layer on the second substrate, and forming the second meta-atoms above the second wavelength conversion layer by patterning the meta-atom material layer, in which the second meta-atoms and the first meta-atoms are formed at the same time.

In some embodiments, the first meta-atoms have first width, and determining the first width of the first meta-atoms includes giving height of the first meta-atoms, giving a fixed period of the first meta-atoms, establishing database of the first meta-atoms with different width, and determining the first width of the first meta-atoms, in which the first meta-atoms with the first width have a reflectance higher than 75% to the first color light and transmittance higher than 90% to the second color light.

In some embodiments, the second meta-atoms have second width, and the second width of the second meta-atoms is determined based on the database, in which the second meta-atoms with the second width have a reflectance higher than 75% to the first color light and transmittance higher than 90% to the third color light.

In some embodiments, the second width is the same as the first width.

In some embodiments, the first meta-atoms with the first width have a reflectance higher than 95%, and the first width is greater than the second width.

In some embodiments, the manufacturing method further includes forming an adhesive layer on the first substrate and the first wavelength conversion layer.

The display device in some embodiments of the present disclosure includes the metasurface used to improve photoluminescence efficiency. Moreover, the manufacturing process of the metasurface in some embodiments of the present disclosure is simple, so the cost of the manufacturing the metasurface is reduced.

It is to be understood that both the foregoing general description and the following detailed description are by examples, and are intended to provide further explanation of the description as claimed.

BRIEF DESCRIPTION OF THE DRAWINGS

FIGS. 7-13 illustrate cross-section views of manufacturing the display device in some embodiments of the present disclosure.

DETAILED DESCRIPTION

Some embodiments of the present disclosure are related to a display device including a metasurface. Micro light-emitting diodes are used as light source in the display device in some embodiments of the present disclosure, and the display device includes a wavelength conversion layer used to convert a first color light emitted from the micro light-emitting diode into a second color light. The metasurface is disposed on the wavelength conversion layer, and the meta-surface is designed to pass the second color light through the metasurface and reflect the first color light back to the wavelength conversion layer. The photoluminescence efficiency is increased to improve the color purity of the display device accordingly.

Figure 1:
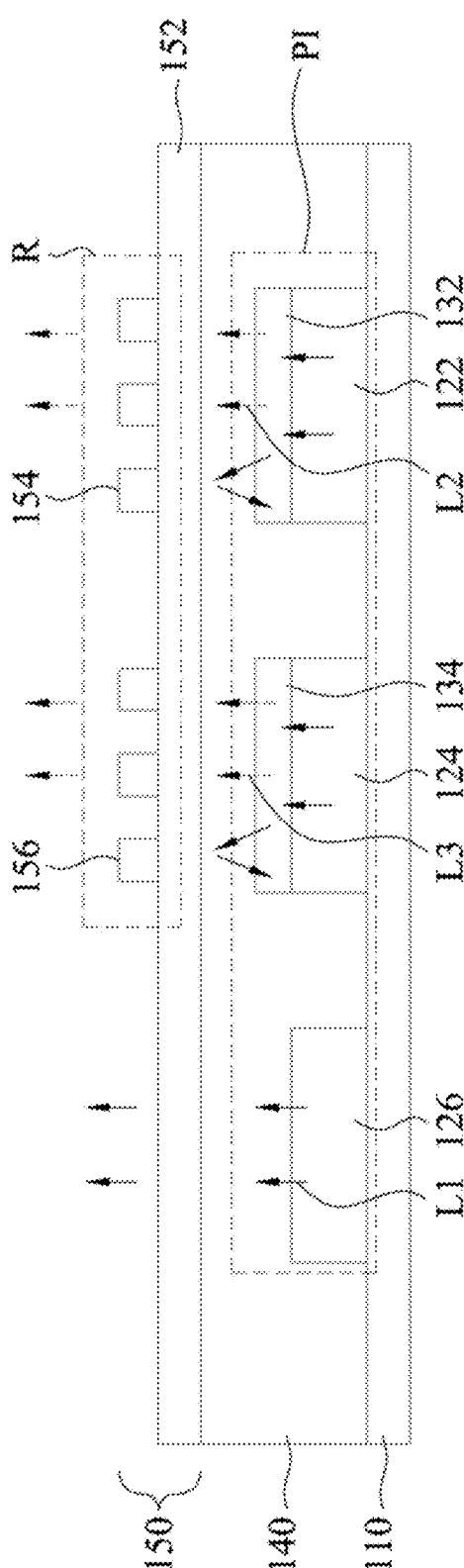
FIG. 1 illustrates a cross-section view of the display device in some embodiments of the present disclosure.

FIG. 1 illustrates a cross-section view of the display device 100 in some embodiments of the present disclosure. The display device 100 includes a first substrate 110, a plurality of light-emitting diodes 120, a first wavelength conversion layer 132, a second wavelength conversion layer 134 and a metasurface 150.

The first substrate 110 may be a circuit board, and the first substrate 110 includes a wiring layer. The light-emitting diodes 120 are arranged on the first substrate 110. The light-emitting diodes 120 emit a first color light L1, and the light-emitting diodes 120 includes a first light-emitting diode 122, a second light-emitting diode 124 and a third light-emitting diode 126. That is, the first light-emitting diode 122, the second light-emitting diode 124 and the third light-emitting diode 126 of the light-emitting diodes 120 all emit the first color light L1. In some embodiments, the first color light L1 is blue light. The light-emitting diodes 120 are electrically connected with electrodes of the wiring layer of the first substrate 110. In some embodiments, any suitable light-emitting diodes 120 may be used, such as micro light-emitting diodes.

The first wavelength conversion layer 132 is on the first light-emitting diode 122, and is configured to convert the first color light L1 emitted from the first light-emitting diode 122 into a second color light L2, and the first color light L1 and the second color light L2 are different color lights. The second wavelength conversion layer 134 is on the second light-emitting diode 124, and is configured to convert the first color light L1 emitted from the second light-emitting diode 124 into a third color light L3, and the first color light L1, the second color light L2 and the third color light L3 are different color light. In some embodiments, the second color light L2 is red light, and the third color light L3 is green light. The first wavelength conversion layer 132 and the second wavelength conversion layer 134 may include many quantum dots used for photoluminescence to change the wavelength of the light entering the quantum dots, thereby changing the color of the light. The wavelength conversion layer may not be disposed on the third light-emitting diode 126, so that the first color light L1 emitted from the third light-emitting diode 126 will not be changed. The first light-emitting diode 122 and the first wavelength conversion layer 132 are combined to emit the second color light L2, the second light-emitting diode 124 and the second wavelength conversion layer 134 are combined to emit the third color light L3, and the third light-emitting diode 126 may emit the first color light L1. Therefore, the first light-emitting diode 122, the first wavelength conversion layer 132, the second light-emitting diode 124, the second wavelength conversion layer 134 and the third light-emitting diode 126 constitute a pixel unit PI. It is noted that although FIG. 1 only illustrates a pixel unit PI, the display device 100 includes many pixel units in practice.

The metasurface 150 is above the first wavelength conversion layer 132, and is configured to reflect the first color light L1 and pass the second color light L2. That is, the first wavelength conversion layer 132 is between the metasurface 150 and the first light-emitting diode 122. The metasurface 150 includes a second substrate 152 and a plurality of first meta-atoms 154. The second substrate 152 is above the first wavelength conversion layer 132. The first meta-atoms 154 are arranged on the first wavelength conversion layer 132 and the second substrate 152. The second substrate 152 may be a transparent substrate, such as glass substrate, so the first color light L1, the second color light L2 and the third color light L3 may pass through the second substrate 152. The sizes and the arrangement of the first meta-atoms 154 may be designed to have high reflectance to the first color light L1 and high transmittance and low absorption to the second color light L2. Specifically, when the first color light L1 is emitted to the first wavelength conversion layer 132, a little portion of the first color light L1 may not be emitted to the quantum dots of the first wavelength conversion layer 132, so that a little portion of the first color light L1 may pass through the first wavelength conversion layer 132. When the metasurface 150 has high reflectance to the first color light L1 and high transmittance and low absorption to the second color light L2, the second color light L2 may pass through the metasurface 150, and the first color light L1 may be reflected back to the first wavelength conversion layer 132 for photoluminescence again. As such, photoluminescence efficiency may be improved and the proportion of the first color light L1 converted into the second color light L2 may be increased, thereby improving the color purity of the second color light L2.

In some embodiments, the metasurface 150 is further above the second wavelength conversion layer 134. That is, the second wavelength conversion layer 134 is between the metasurface 150 and the second light-emitting diode 124. Specifically, the second substrate 152 of the metasurface 150 is further above the second wavelength conversion layer 134, and the metasurface 150 further includes a plurality of second meta-atoms 156. The sizes and the arrangement of the second meta-atoms 156 may be designed to have high reflectance to the first color light L1 and high transmittance and low absorption to the third color light L3. Specifically, when the first color light L1 is emitted to the second wavelength conversion layer 134, a little portion of the first color light L1 may not be emitted to the quantum dots of the second wavelength conversion layer 134, so that a little portion of the first color light L1 may pass through the second wavelength conversion layer 134. When the metasurface 150 has high reflectance to the first color light L1 and high transmittance and low absorption of the third color light L3, the third color light L3 may pass through the metasurface 150, and the first color light L1 may be reflected back to the second wavelength conversion layer 134 for photoluminescence again. As such, photoluminescence efficiency may be improved and the proportion of the first color light L1 converted into the third color light L3 may be increased, thereby improving the color purity of the third color light L3.

The metasurface 150 may also have high reflectance to ultraviolet light in the environment in addition to the first color light L1. The ultraviolet light in the environment may not easily pass through the metasurface 150 and enter the first wavelength conversion layer 132 and the second wavelength conversion layer 134. As such, the quantum dots in the first wavelength conversion layer 132 and the second wavelength conversion layer 134 will not be damaged by the ultraviolet light, thereby improving the lifetime and the reliability of the display device 100. The metasurface 150 may also reduce the light leakage problem of the light-emitting diodes 120 and reduce the damage to human eyes.

The display device 100 further includes an adhesive layer 140, and the adhesive layer 140 is between the first wavelength conversion layer 132 and the metasurface 150. The adhesive layer 140 is also between the second wavelength conversion layer 134 and the metasurface 150, between the third light-emitting diode 126 and the metasurface 150. The adhesive layer 140 may be used to adhere the metasurface 150 to the first substrate 110.

Figure 2:
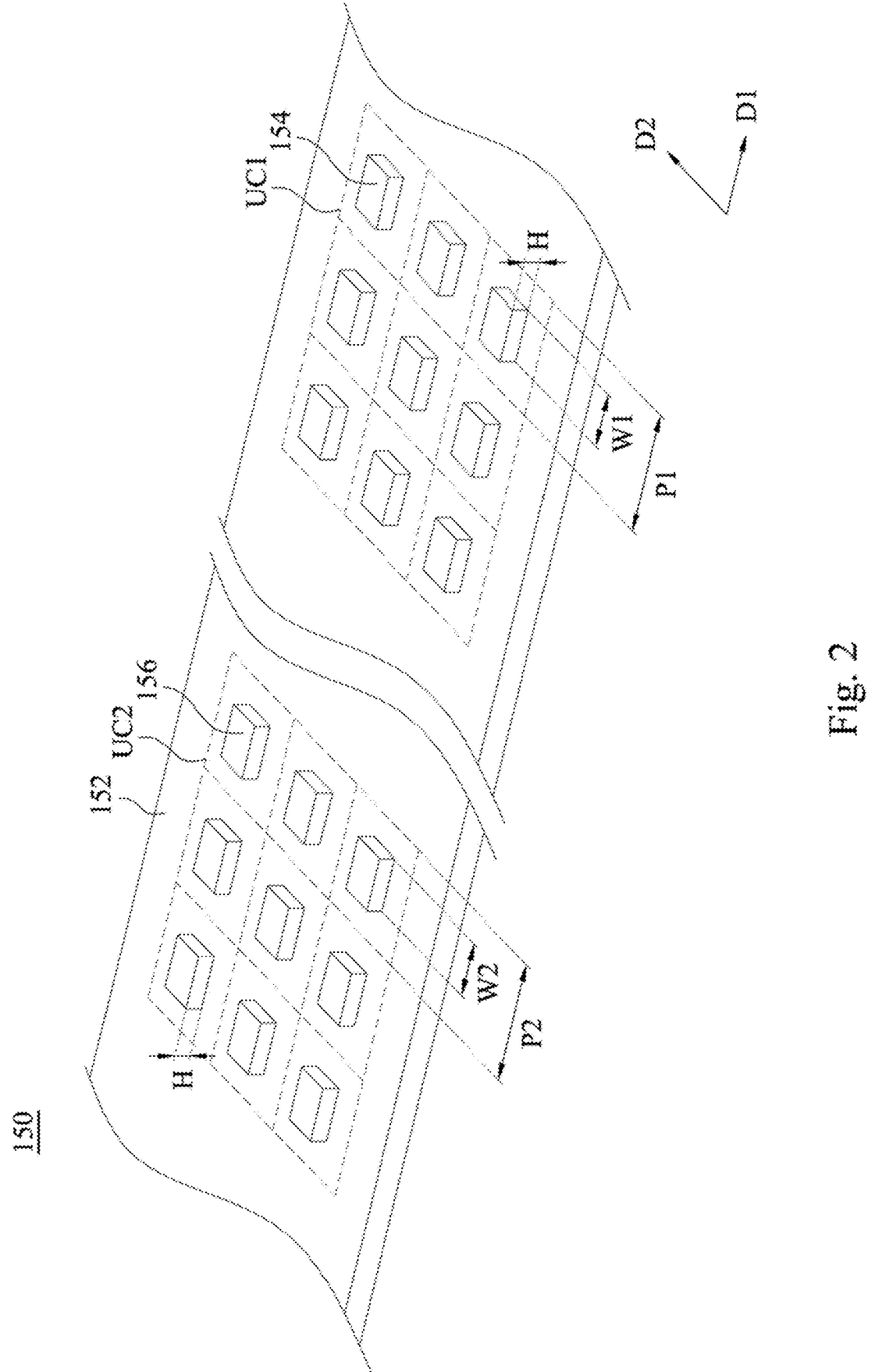
FIG. 2 illustrates a perspective view of the metasurface in region R in FIG. 1 in some embodiments of the present disclosure.

FIG. 2 illustrates a perspective view of the metasurface 150 in region R in FIG. 1 in some embodiments of the present disclosure. The first meta-atoms 154 have same height H and same first width W1, and each of the first meta-atoms 154 is in a first unit cell UC1. The first unit cells UC1 are arranged in a fixed period P1. That is, the first meta-atoms 154 may be arranged in a fixed period. Specifically, the metasurface 150 may include many first unit cells UC1, the first unit cells UC1 may be arranged in a first direction D1 and a second direction D2, and the first direction D1 and the second direction D2 are different. The first unit cells UC1 may be in any suitable shape, and the first unit cells UC1 are arranged in the fixed period P1. The term "fixed period" herein means that the first unit cells UC1 have identical scales. For example, in FIG. 2, the first unit cells UC1 may all be squares, and the scales (such as length of side) are the same, so that the first meta-atoms 154 may be arranged in the fixed period. One first meta-atom 154 is disposed in every first unit cell UC1, and the relative positions of each of the first meta-atoms 154 relative to the first unit cell UC1 are the same (such as the first meta-atoms 154 are all at the center of the first unit cells UC1). The height H of every first meta-atom 154 is the same, and the first width W1 of every first meta-atom 154 is the same. In some embodiments, the first meta-atoms 154 are arranged in the first direction D1, and the first meta-atoms 154 are aligned with each other in the first direction D1. The first meta-atoms 154 may be also arranged in the second direction D2, and the first meta-atoms 154 are aligned with each other in the second direction D2.

The second meta-atoms 156 have same height H and same second width W2, and each of the second meta-atoms 156 is in a second unit cell UC2. The second meta-atoms 156 are arranged in the fixed period P1, and the second width W2 is same as first width W1. That is, the arrangement of the second meta-atoms 156 may be the same as the arrangement of the first meta-atoms 154, and the sizes of the second meta-atoms 156 and the sizes of the first meta-atoms 154 may be the same. In some embodiments, the first meta-atoms 154 and the second meta-atoms 156 may be in any suitable shape, such as square column or cylinder. It is noted that the first unit cells UC1 and the second unit cells UC2 are virtual cells, so the grids of the first unit cells UC1 and the second unit cells UC2 are not shown on the second substrate 152 in practice.

Figure 3:
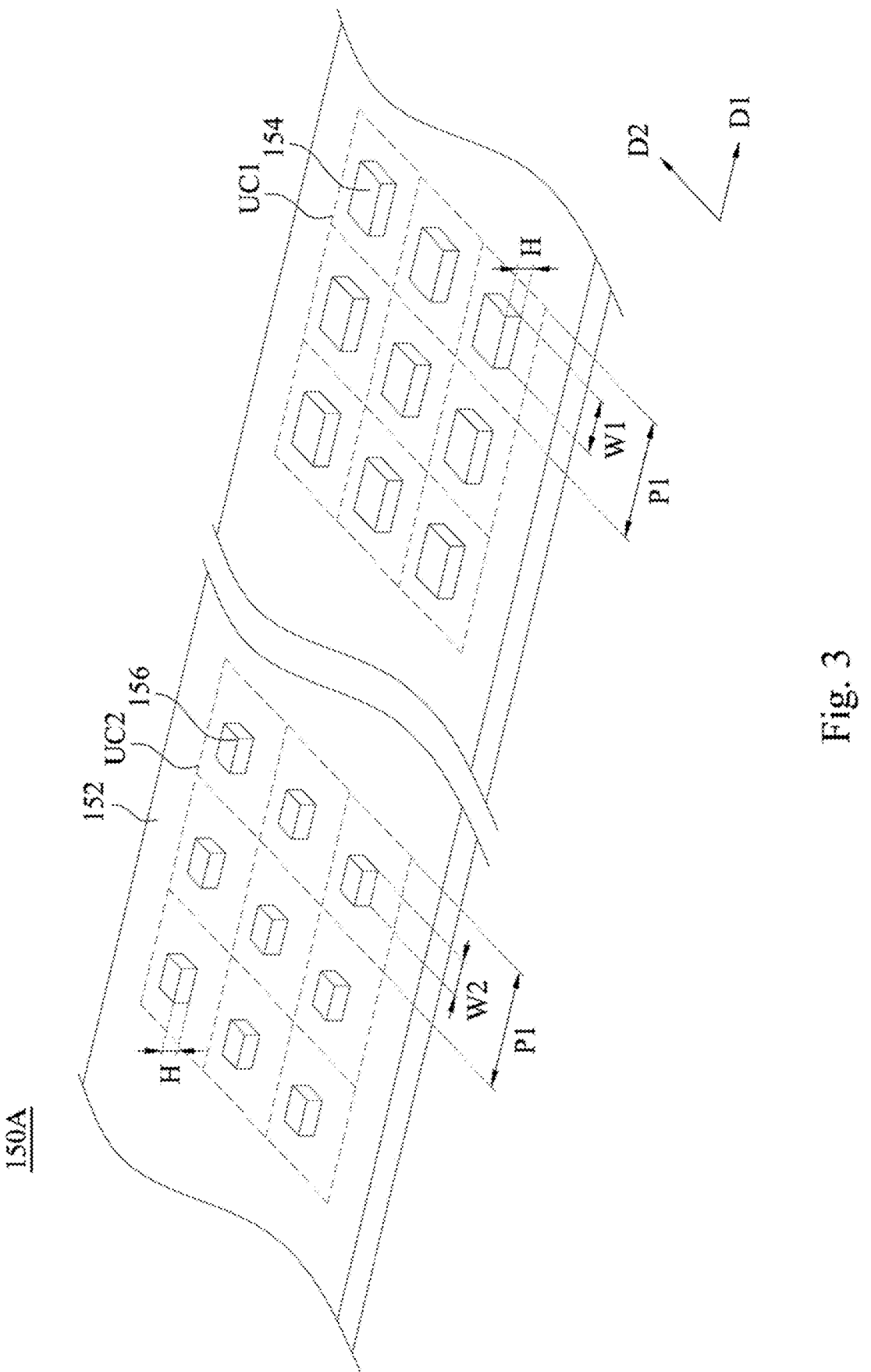
FIG. 3 illustrates a perspective view of a metasurface in some other embodiments of the present disclosure.

FIG. 3 illustrates a perspective view of a metasurface 150A in some other embodiments of the present disclosure. The metasurface 150A is similar to the metasurface 150, and the difference is that the second width W2 is different from the first width W1. For example, when the wavelength of the second color light L2 is greater than the wavelength of the third color light L3, the first width W1 is greater than the second width W2. That is, the first width W1 of the first meta-atoms 154 on the first wavelength conversion layer 132 and the second width W2 of the second meta-atoms 156 on the second wavelength conversion layer 134 are different. When the first width W1 of the first meta-atoms 154 and the second width W2 of the second meta-atoms 156 are different, the first meta-atoms 154 may be designed for the second color light L2, and the second meta-atoms 156 may be designed for the third color light L3. Other details of the metasurface 150A are the same as details of the metasurface 150 and are not described herein repeatedly.

Figure 4:
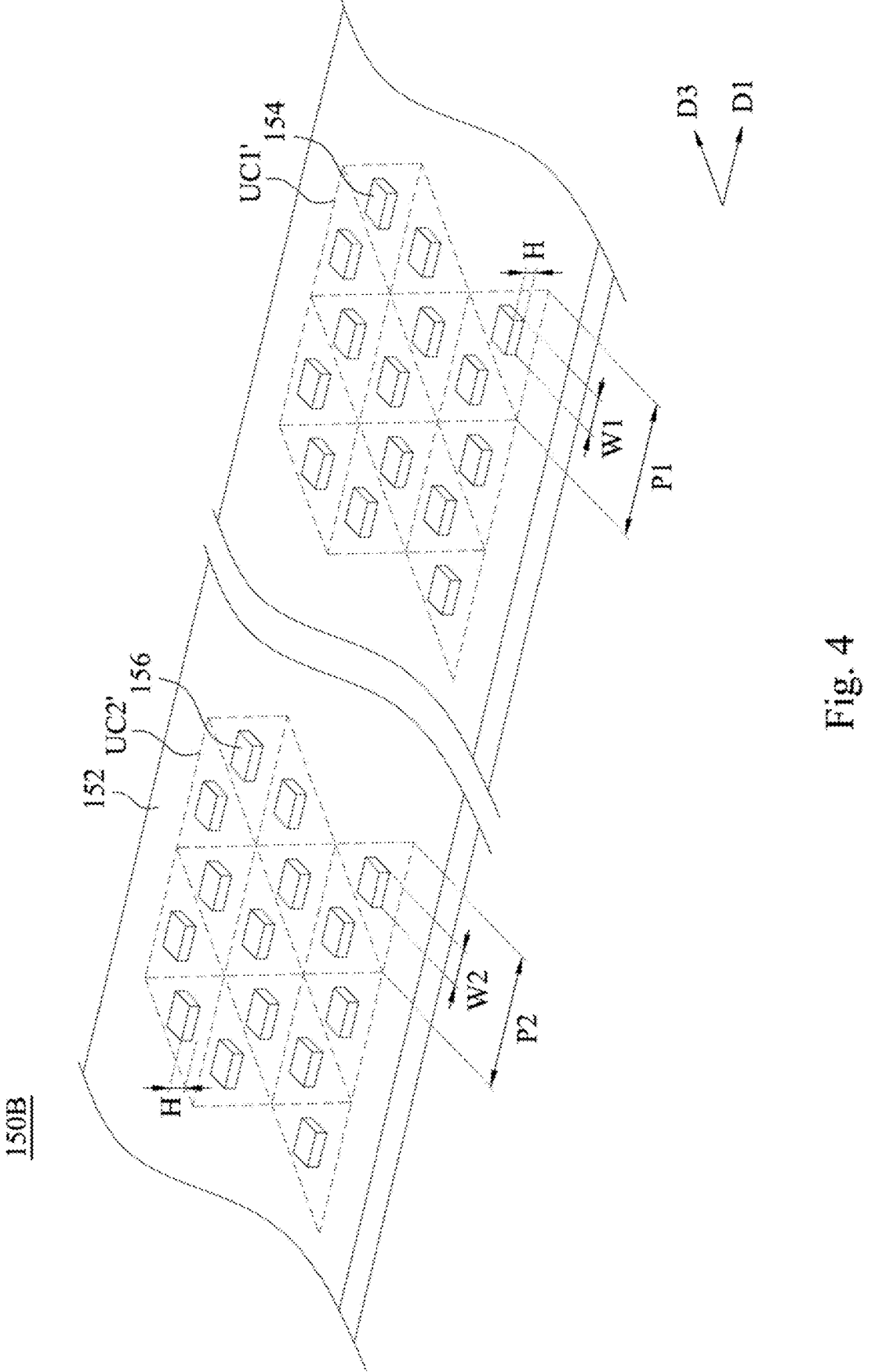
FIG. 4 illustrates a perspective view of a metasurface in some other embodiments of the present disclosure.

FIG. 4 illustrates a perspective view of a metasurface 150B in some other embodiments of the present disclosure. The metasurface 150B is similar to the metasurface 150, and the difference is the shape of the first unit cells UC1' and the second unit cells UC2' of the metasurface 150B. In FIG. 4, the first unit cells UC1' and the second unit cells UC2' may be triangle. The first unit cells UC1' may be arranged in a fixed period P2 in the first direction D1 and a third direction D3, the second unit cells UC2' may be arranged in the fixed period P2 in the first direction D1 and the third direction D3, and the first direction D1 is different from the third direction D3. Therefore, the arrangement of the first meta-atoms 154 and the second meta-atoms 156 in FIG. 4 are different from the arrangement of the first meta-atoms 154 and the second meta-atoms 156 in FIG. 2. In some embodiments, the first meta-atoms 154 are arranged in the first direction D1, but the first meta-atoms 154 are not aligned with each other in the first direction D1. The first meta-atoms 154 are arranged in the third direction D3, but the first meta-atoms 154 are not aligned with each other in the third direction D3. Other details of the metasurface 150B are the same as details of the metasurface 150 and are not described herein repeatedly.

Figure 5:
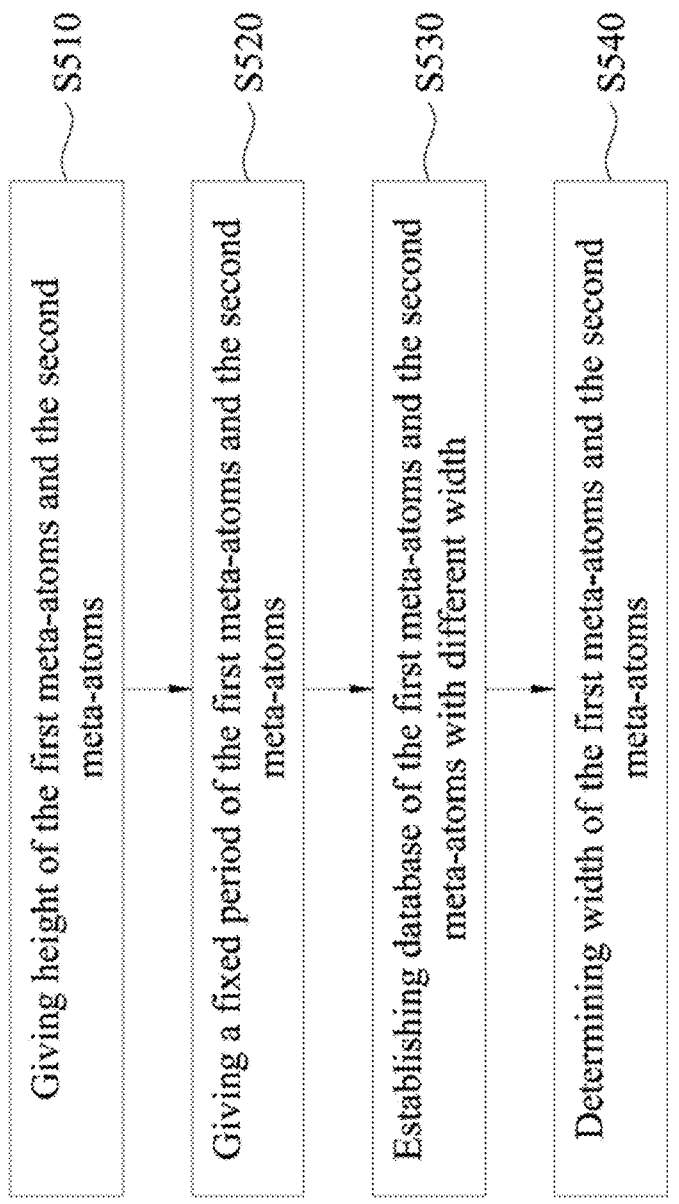
FIG. 5 illustrates a flow chart of determining parameters of the first meta-atoms and the second meta-atoms of the metasurface in some embodiments of the present disclosure.

FIG. 5 illustrates a flow chart of determining parameters of the first meta-atoms 154 and the second meta-atoms 156 of the metasurface 150 in some embodiments of the present disclosure. Referring to FIGS. 2 and 5, in step S510, the height H of the first meta-atoms 154 and the second meta-atoms 156 is given. In some embodiments, the height H of the first meta-atoms 154 and the second meta-atoms 156 is between 100 nm to 300 nm, and is beneficial to reduce the size of the display device 100 in the vertical direction. Subsequently, in step S520, the fixed period P1 of the first meta-atoms 154 and the second meta-atoms 156 is given. In some embodiments, the fixed period P1 of the first meta-atoms 154 and the second meta-atoms 156 is between 200 nm to 400 nm. The range of the height H and the fixed period P1 are determined based on the size of the display device 100 and/or the size of the pixel units PI preliminarily. Subsequently, in step S530, database of the first meta-atoms 154 and the second meta-atoms 156 with different width is established. Specifically, the maps of reflectance, transmittance and absorptance of the first meta-atoms 154 and the second meta-atoms 156 with different width for light of different wavelength are established. Finally, in step S540, the width of the first meta-atoms 154 and the second meta-atoms 156 is determined. Specifically, the metasurface 150 having high reflectance to the first color light and high transmittance to the second color light and the third color light is achieved by determining the width of the first meta-atoms 154 and the second meta-atoms 156 based on the maps obtained in step S530. The parameters of the metasurface 150A in FIG. 3 and the metasurface 150B in FIG. 4 may also be determined by the steps in FIG. 5.

Figure 6A:
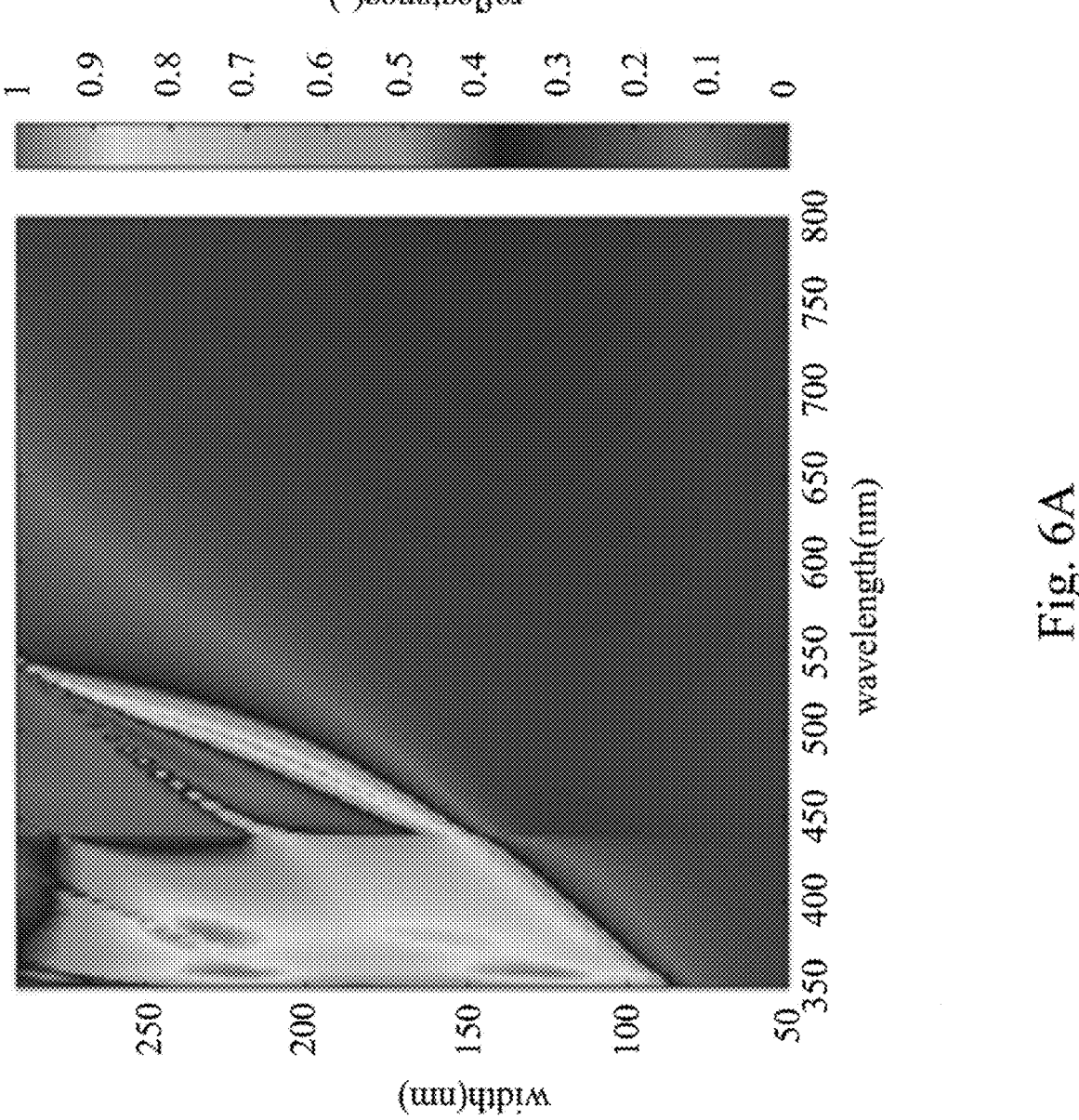
FIG. 6A, FIG. 6B and FIG. 6C respectively illustrate the maps of reflectance, transmittance and absorptance of the first meta-atoms and the second meta-atoms for light of different wavelengths obtained in FIG. 5.
Figure 6B:
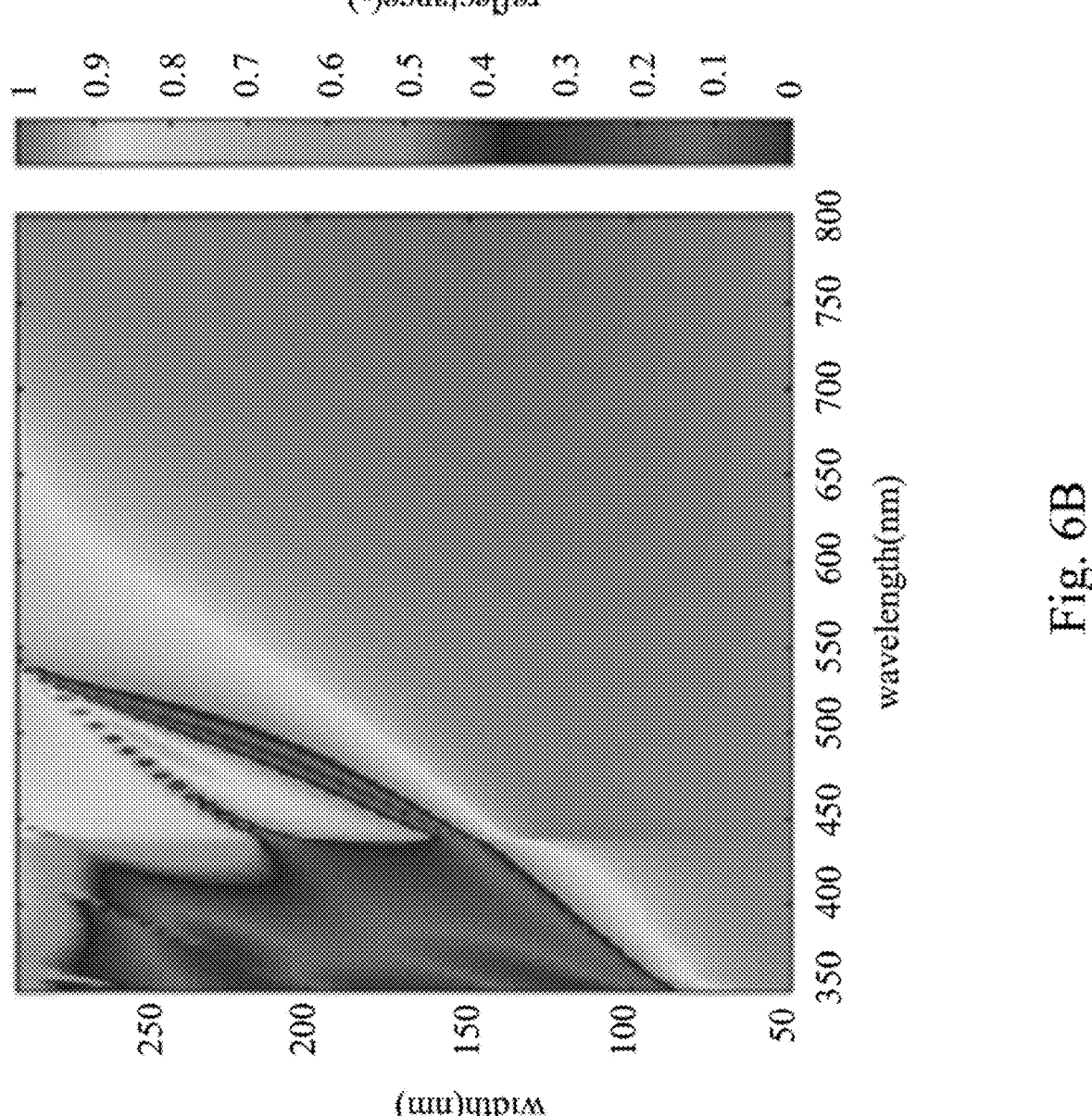
Figure 6C:
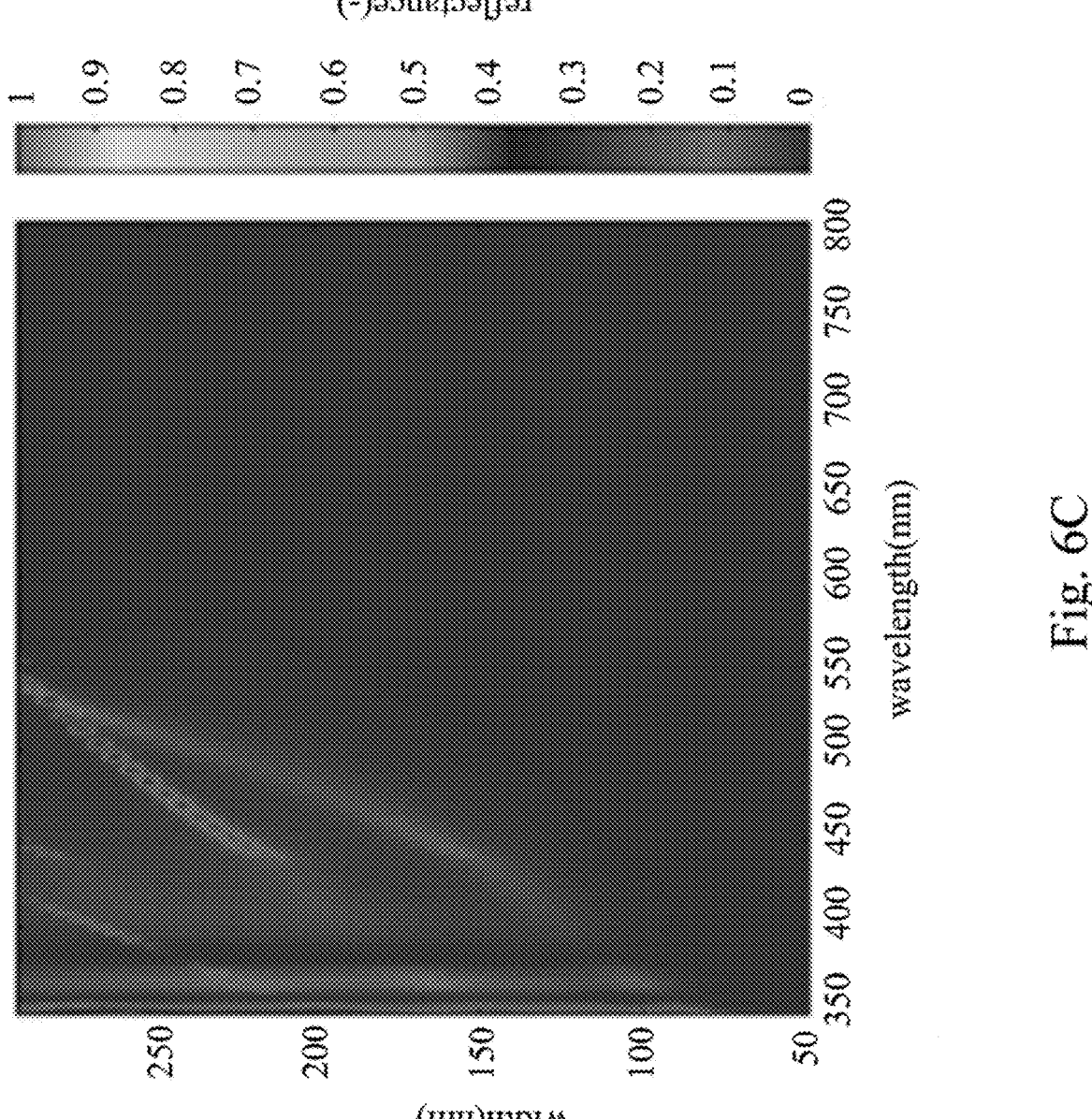

FIG. 6A, FIG. 6B and FIG. 6C respectively illustrate the maps of reflectance, transmittance and absorptance of the first meta-atoms 154 and the second meta-atoms 156 for light of different wavelengths obtained in step S530 in FIG. 5. X-axis of FIG. 6A, FIG. 6B and FIG. 6C is wavelength, Y-axis is the width of the meta-atoms, and color scale represent reflectance, transmittance and absorptance in FIG. 6A, FIG. 6B and FIG. 6C respectively. The width of the first meta-atoms 154 and the second meta-atoms 156 may be determined based on FIG. 6A, FIG. 6B and FIG. 6C. Specifically, the first meta-atoms 154 are designed to have high reflectance to the first color light and high transmittance to the second color light. The second meta-atoms 156 are designed to have high reflectance to the first color light and high transmittance to the third color light. Take the first color light as blue light, the second color light as red light, and the third color light as green light as an example, in some embodiments, suitable width of the first meta-atoms 154 and the second meta-atoms 156 can be found in FIG. 6A, FIG. 6B and FIG. 6C, and the suitable width may achieve high reflectance (such as higher than 75%) to the first color light and high transmittance (such as higher than 90%) to the second color light and the third color light. Therefore, in this embodiment, the first width W1 of the first meta-atoms 154 and second width W2 of the second meta-atoms 156 are the same, as shown in FIG. 2. When the first width W1 of the first meta-atoms 154 and second width W2 of the second meta-atoms 156 are the same, the manufacturing process of the metasurface 150 is relatively simple. For example, the alignment between the metasurface 150 and the pixel unit PI may be looser.

In some other embodiments, it is also feasible to find the suitable widths of the first meta-atoms 154 and the second meta-atoms 156 respectively. A first suitable width and a second suitable width can be found in FIG. 6A, FIG. 6B and FIG. 6C. The first suitable width may achieve high reflectance (such as higher than 95%) to the first color light and high transmittance (such as higher than 90%) to the second color light. The second suitable width may achieve high reflectance (such as higher than 75%) to the first color light and high transmittance (such as higher than 90%) to the third color light. In this embodiment, the first suitable width may be applied to the first width W1 of the first meta-atoms 154, and the second suitable width may be applied to the second width W2 of the second meta-atoms 156. Therefore, the first width W1 of the first meta-atoms 154 and the second width W2 of the second meta-atoms 156 may be different, as shown in FIG. 3. As such, the first color light, the first color light, the second color light and the third color light of the display device have appropriate transmittance.

Figure 7:
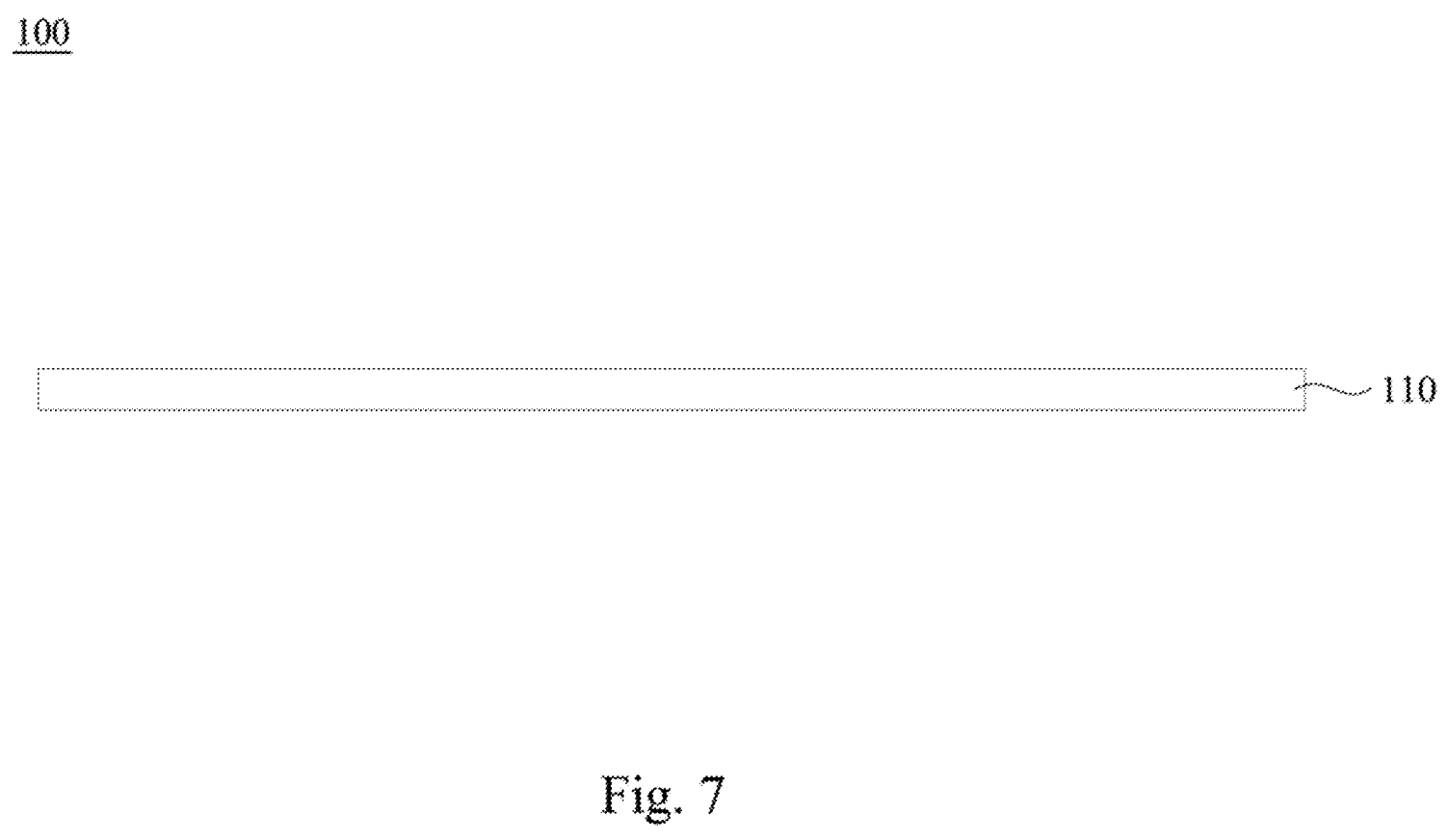

FIGS. 7-13 illustrate cross-section views of manufacturing the display device 100 in some embodiments of the present disclosure. In FIG. 7, the first substrate 110 is provided. The first substrate 110 may be a circuit board, and the first substrate 110 includes a wiring layer.

Figure 8:
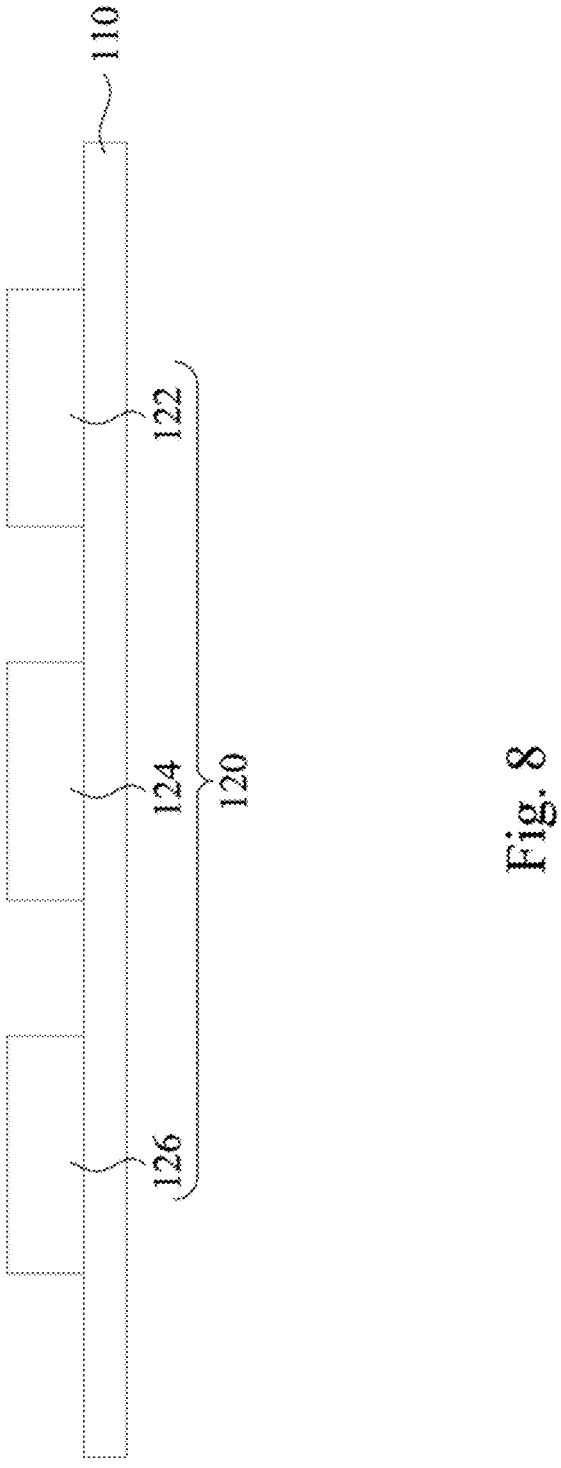

Subsequently, in FIG. 8, the first light-emitting diode 122, the second light-emitting diode 124 and the third light-emitting diode 126 of the light-emitting diodes 120 are arranged on the first substrate 110. The first light-emitting diode 122, the second light-emitting diode 124 and the third light-emitting diode 126 are identical light-emitting diodes. That is, the first light-emitting diode 122, the second light-emitting diode 124 and the third light-emitting diode 126 emit same kind of light source. In some embodiments, the first light-emitting diode 122, the second light-emitting diode 124 and the third light-emitting diode 126 are transferred to the first substrate 110 by mass transfer. Since the first light-emitting diode 122, the second light-emitting diode 124 and the third light-emitting diode 126 are identical light-emitting diodes, all the light-emitting diodes 120 are transferred to the first substrate 110 during the same mass transfer. As such, the cost caused by multiple mass transfers may be reduced.

Figure 9:
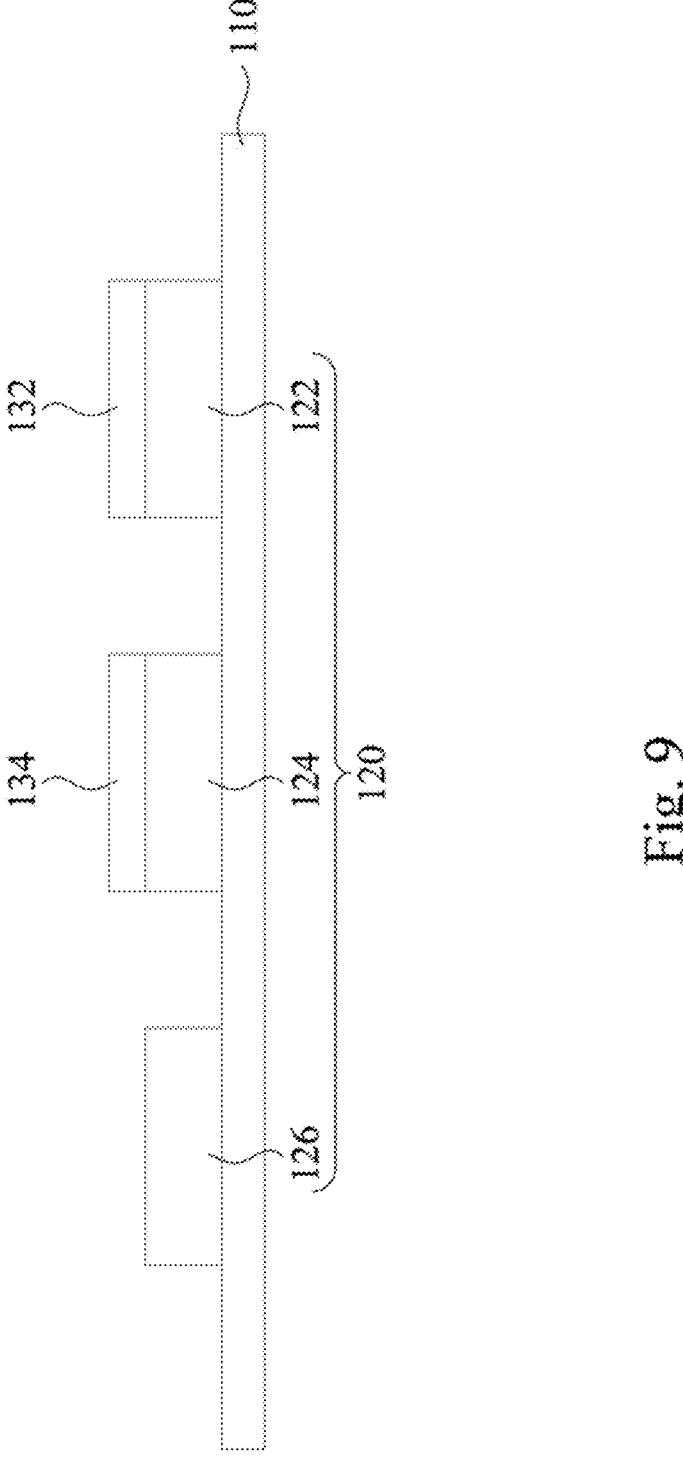

Subsequently, in FIG. 9, the first wavelength conversion layer 132 is formed on the first light-emitting diode 122 and the second wavelength conversion layer 134 is formed on the second light-emitting diode 124. Specifically, a gel layer including first quantum dots are coated on the first light-emitting diode 122, a gel layer including second quantum dots are coated on the second light-emitting diode 124. The first quantum dots may be used to convert the first color light into the second color light, and the second quantum dots may be used to convert the first color light into the third color light. Subsequently, the gel layers are cured, so the first wavelength conversion layer 132 is formed on the first light-emitting diode 122 and the second wavelength conversion layer 134 is formed on the second light-emitting diode 124.

Figure 10:
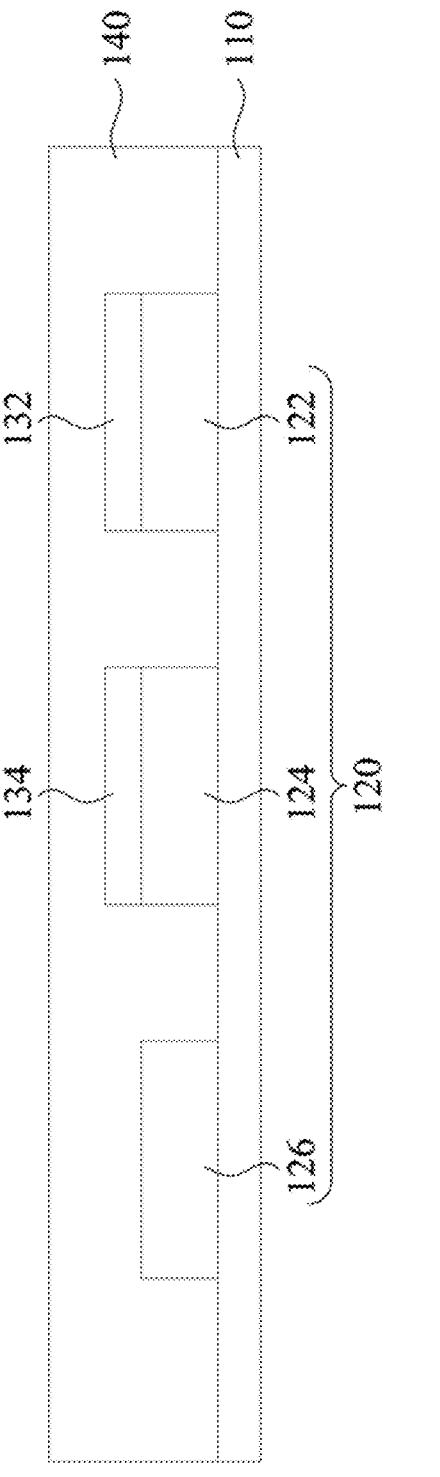

Subsequently, in FIG. 10, the adhesive layer 140 is formed on the first substrate 110, the third light-emitting diode 126, the first wavelength conversion layer 132 and the second wavelength conversion layer 134. The adhesive layer 140 completely covers the first substrate 110, the first light-emitting diode 122, the second light-emitting diode 124, the third light-emitting diode 126, the first wavelength conversion layer 132 and the second wavelength conversion layer 134.

Figure 11:
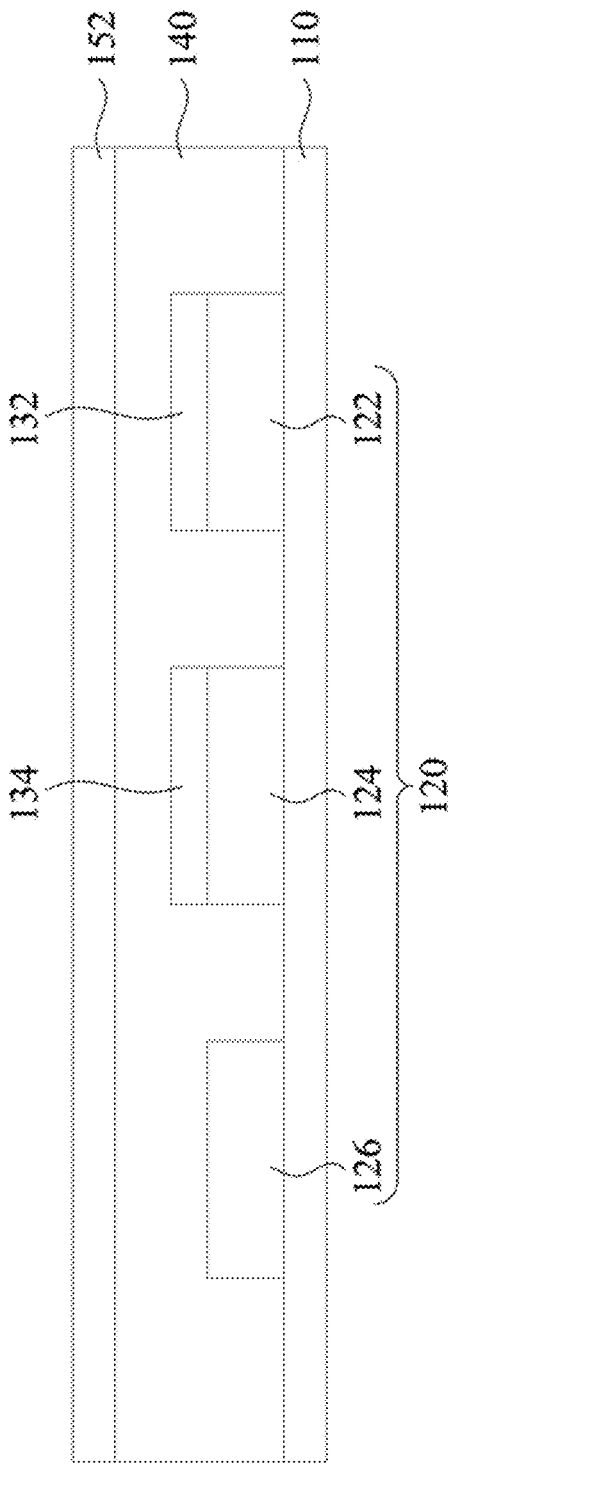
Figure 12:
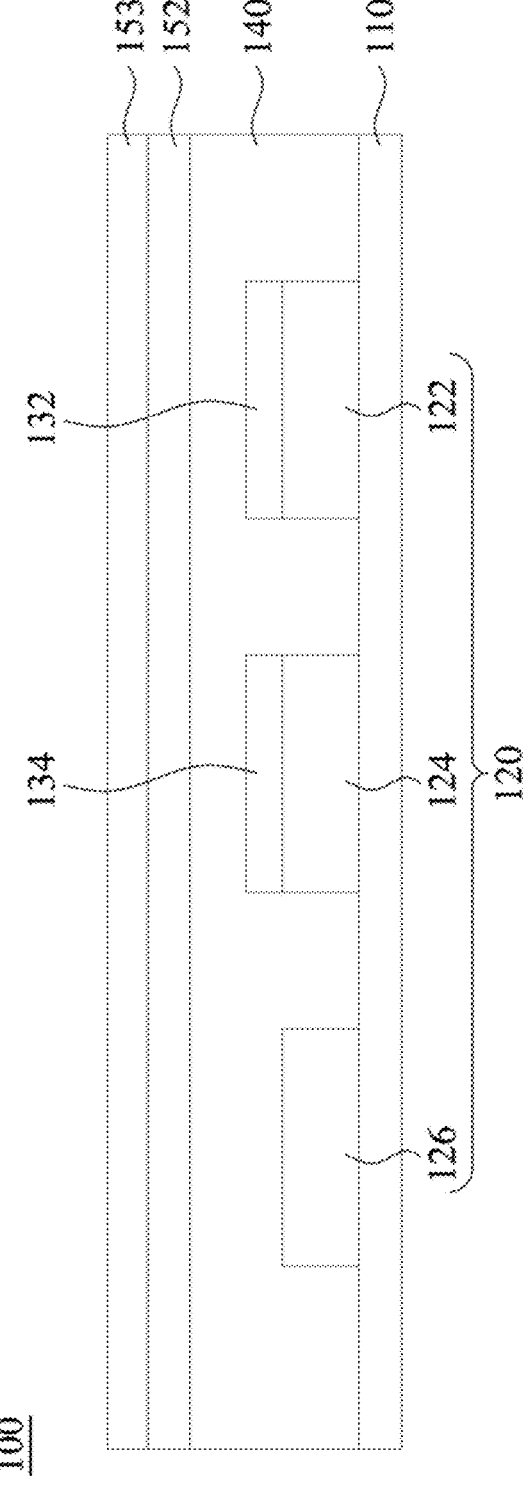

Subsequently, in FIG. 11, the second substrate 152 is disposed on the adhesive layer 140. Subsequently, in FIG. 12, a meta-atom material layer 153 is formed on the second substrate 152. The thickness of the meta-atom material layer 153 may be determined in step S510 of FIG. 5. In some embodiments, the meta-atom material layer 153 is dielectric material layer (such as titanium dioxide layer).

Figure 13:
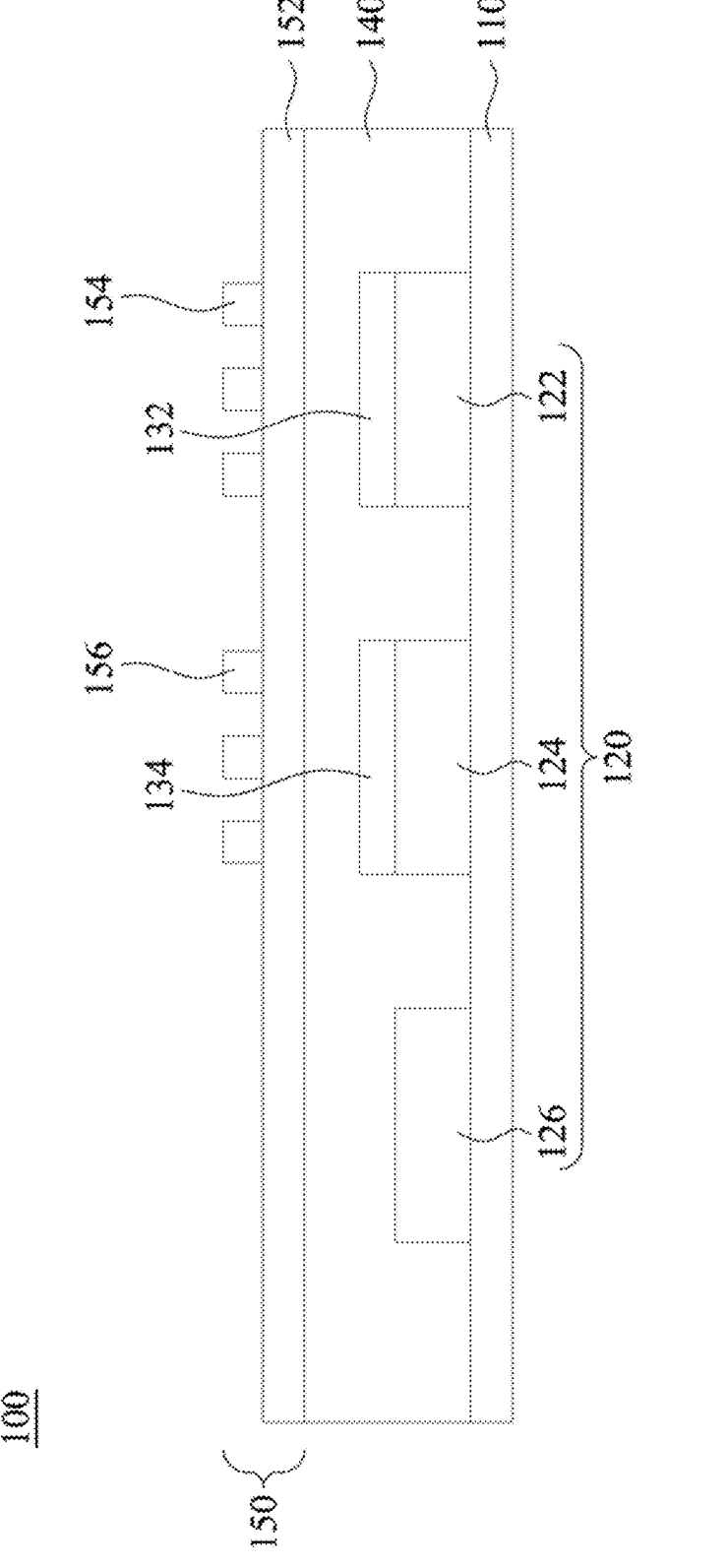

Subsequently, in FIG. 13, the first meta-atoms 154 are formed above the first wavelength conversion layer 132 and the second meta-atoms 156 are formed above the second wavelength conversion layer 134. Specifically, the meta-atom material layer 153 is patterned by electron beam lithography, nanoimprint lithography or other techniques to form the first meta-atoms 154 and the second meta-atoms 156. The first meta-atoms 154 and the second meta-atoms 156 are directly formed from the meta-atom material layer 153, so the first meta-atoms 154 and the second meta-atoms 156 are made of single material. The first meta-atoms 154 and the second meta-atoms 156 are formed in many regions at the same time to reduce the cost of manufacturing the metasurface 150. The arrangements of the first meta-atoms 154 and the second meta-atoms 156 are determined in step S520 in FIG. 5, and the width of the first meta-atoms 154 and the second meta-atoms 156 are determined in step S540. In FIG. 13, the meta-atom material layer 153 above the third light-emitting diode 126 is completely removed, so the meta-atoms of the metasurface 150 is not above the third light-emitting diode 126. The first color light emitted from the third light-emitting diode 126 may completely pass through the metasurface 150. As such, the metasurface 150 is formed above the first wavelength conversion layer 132 and the second wavelength conversion layer 134.

Figure 14:
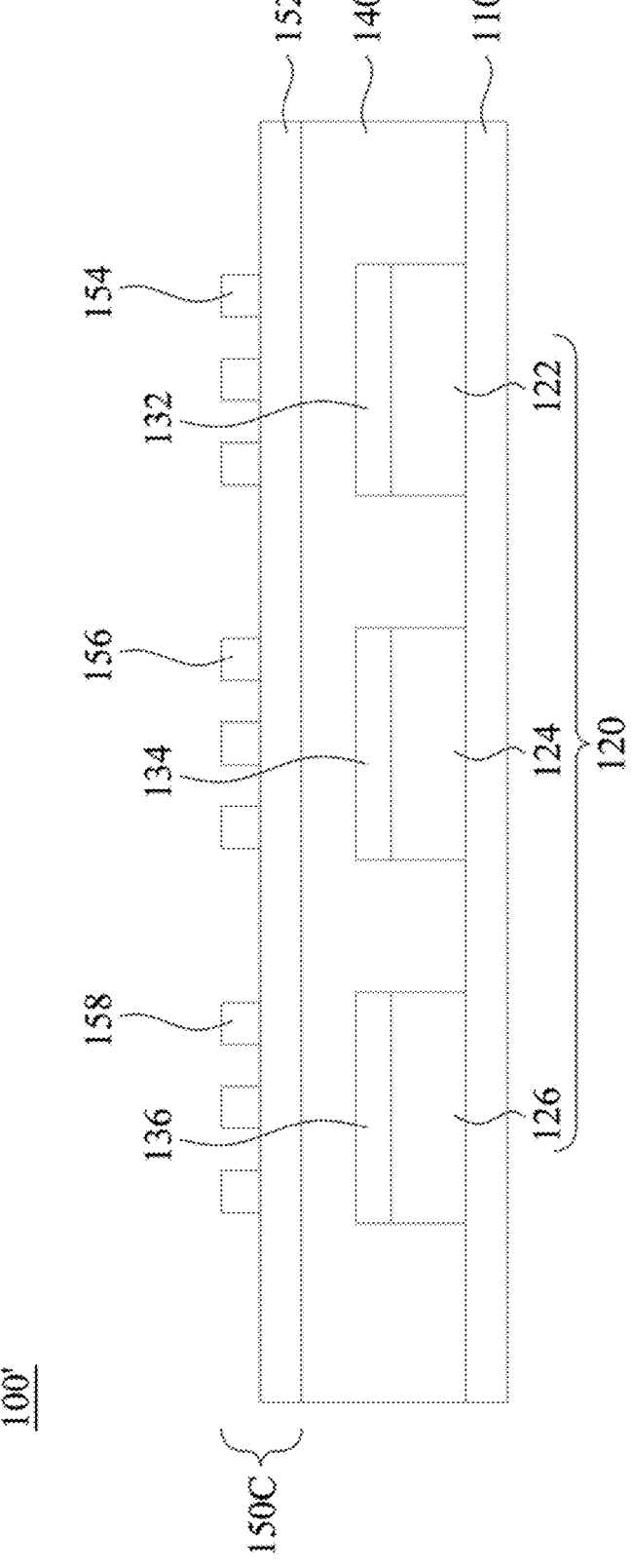
FIG. 14 illustrates a cross section view of a display device in some other embodiments of the present disclosure.

FIG. 14 illustrates a cross section view of a display device 100' in some other embodiments of the present disclosure. The difference between the display device 100' and the display device 100 is that the display device 100' further includes a third wavelength conversion layer 136 and third meta-atoms 158. Specifically, the first light-emitting diode 122, the second light-emitting diode 124 and the third light-emitting diode 126 of the light-emitting diodes 120 may not emit visible light. For example, the light-emitting diodes 120 all emit ultraviolet light. The first wavelength conversion layer 132, the second wavelength conversion layer 134 and the third wavelength conversion layer 136 are disposed on the first light-emitting diode 122, the second light-emitting diode 124 and the third light-emitting diode 126 respectively. The first wavelength conversion layer 132 is used to convert the ultraviolet light into the second color light, the second wavelength conversion layer 134 is used to convert the ultraviolet light into the third color light, and the third wavelength conversion layer 136 is used to convert the ultraviolet light into the first color light. The metasurface 150C includes the first meta-atoms 154, the second meta-atoms 156 and the third meta-atoms 158. The first meta-atoms 154 may be designed to have high transmittance to the second color light and high reflectance to the ultraviolet light. The second meta-atoms 156 may be designed to have high transmittance to the third color light and high reflectance to the ultraviolet light. The third meta-atoms 158 may be designed to have high transmittance to the first color light and high reflectance to the ultraviolet light. As such, the metasurface 150C may be used to improve photoluminescence efficiency to improving the color purity of the display device. Other details of the display device 100' are the same as details of the display device 100 and are not described herein repeatedly.

As mentioned above, the metasurface in some embodiments of the present disclosure provides advantages. For example, the meta-atoms in the metasurface may be designed for light of different wavelength, so that a portion of the light may pass through the metasurface and the other portion of the light may be reflected. Therefore, the metasurface may reflect light of certain wavelength back to the wavelength conversion layer to improve photoluminescence efficiency. The metasurface may also be used to reflect the ultraviolet light in the environment to reduce the damage to the quantum dots in the wavelength conversion layer caused by the ultraviolet light. Moreover, manufacturing process of the meta-atoms of the metasurface is simple, and the meta-atoms are made of single material. Therefore, the manufacturing cost of the display device may be reduced.

It is to be understood, however, that even though numerous characteristics and advantages of the present invention have been set forth in the foregoing description, together with details of the structure and function of the invention, and changes may be made in detail, especially in matters of shape, size, and arrangement of parts within the principles of the invention to the full extent indicated by the broad general meaning of the terms in which the appended claims are expressed.

What is claimed is:

1. A display device, comprising:
   a first substrate;
   a plurality of light-emitting diodes arranged on the first substrate, wherein the light-emitting diodes emit a blue light, and the light-emitting diodes includes a first light-emitting diode, a second light-emitting diode and a third light-emitting diode;
   a first wavelength conversion layer on the first light-emitting diode, and configured to convert blue emitted from the first light-emitting diode to red light;
   a second wavelength conversion layer on the second light-emitting diode, and configured to convert blue light emitted from the second light-emitting diode to green light; and
   a metasurface above the first wavelength conversion layer and the second wavelength conversion layer, wherein the metasurface have a reflectance higher than 75% to blue light and transmittance higher than 90% to red light and green light.

2. The display device of claim 1, wherein the metasurface comprises:

a second substrate on the first wavelength conversion layer; and a plurality of first meta-atoms arranged on the first wavelength conversion layer and the second substrate, wherein each of the first meta-atoms has a same height and a first width, and the first meta-atoms are arranged in a fixed period.

3. The display device of claim 2, wherein the second substrate of the metasurface is further above the second wavelength conversion layer, and the metasurface further comprises:

a plurality of second meta-atoms arranged on the second wavelength conversion layer and the second substrate, wherein each of the second meta-atoms has a same height and a second width, each of the second meta-atoms is in a second unit cell, and the second unit cells are arranged in the fixed period, wherein the first width is same as the second width.

4. The display device of claim 3, wherein the first meta-atoms and the second meta-atoms are made of a same material.

5. The display device of claim 2, wherein the second substrate of the metasurface is further above the second wavelength conversion layer, and the metasurface further comprises:

a plurality of second meta-atoms arranged on the second wavelength conversion layer and the second substrate, wherein each of the second meta-atoms has a same height and a second width, each of the second meta-atoms is in a second unit cell, and the second unit cells are arranged in the fixed period, and the first width is greater than the second width.

6. The display device of claim 2, wherein the first meta-atoms are arranged along a first direction, and the first meta-atoms are not aligned with each other in the first direction.

7. The display device of claim 2, wherein the first meta-atoms of the metasurface are not above the third light-emitting diode.

8. The display device of claim 1, wherein the first light-emitting diode, the first wavelength conversion layer, the second light-emitting diode, the second wavelength conversion layer and the third light-emitting diode constitute a pixel unit.

9. The display device of claim 1, wherein the first wavelength conversion layer is between the metasurface and the first light-emitting diode.

10. The display device of claim 1, further comprising an adhesive layer between the first wavelength conversion layer and the metasurface.

11. A manufacturing method of a display device, comprising:

providing a first substrate;

arranging a first light-emitting diode, a second light-emitting diode, and a third light-emitting diode on the first substrate, wherein the first light-emitting diode, the second light-emitting diode, and the third light-emitting diode emit blue light;

forming a first wavelength conversion layer on the first light-emitting diode and a second wavelength conversion layer on the second light-emitting diode, wherein the first wavelength conversion layer is configured to convert blue light emitted from the first light-emitting diode into red light, the second wavelength conversion layer is configured to convert blue light emitted from the second light-emitting diode into green light, and the first color light; and forming a metasurface above the first wavelength conversion layer and the second wavelength conversion layer, wherein the metasurface comprises a plurality of first meta-atoms above the first wavelength conversion layer and a plurality of second meta-atoms above the second wavelength conversion layer, wherein the metasurface have a reflectance higher than 75% to blue light and transmittance higher than 90% to red light and green light.

12. The manufacturing method of claim 11, wherein forming the metasurface above the first wavelength conversion layer comprises:

disposing a second substrate above the first wavelength conversion layer;

forming a meta-atom material layer on the second substrate; and forming the first meta-atoms above the first wavelength conversion layer by patterning the meta-atom material layer.

13. The manufacturing method of claim 12, wherein forming the metasurface above the second wavelength conversion layer comprises:

disposing the second substrate above the second wavelength conversion layer;

forming the meta-atom material layer on the second substrate; and forming the second meta-atoms above the second wavelength conversion layer by patterning the meta-atom material layer, wherein the second meta-atoms and the first meta-atoms are formed at the same time.

14. The manufacturing method of claim 12, wherein the first meta-atoms have first width, and determining the first width of the first meta-atoms comprising:

giving a height of the first meta-atoms;

giving a fixed period of the first meta-atoms;

establishing a database of the first meta-atoms with different width; and determining the first width of the first meta-atoms based on the database.

15. The manufacturing method of claim 14, wherein the second meta-atoms have second width, and the second width of the second meta-atoms is determined based on the database.

16. The manufacturing method of claim 15, wherein the second width is the same as the first width.

17. The manufacturing method of claim 15, wherein the first meta-atoms with the first width have the reflectance higher than 95% to blue light, and the first width is greater than the second width.

18. The manufacturing method of claim 11, further comprising:

forming an adhesive layer on the first substrate and the first wavelength conversion layer.

* * * * *